United States Patent
Han

(10) Patent No.: US 8,258,574 B2
(45) Date of Patent: Sep. 4, 2012

(54) SEMICONDUCTOR DECOUPLING CAPACITOR DEVICE

(75) Inventor: Dong-hyun Han, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 190 days.

(21) Appl. No.: 12/656,888

(22) Filed: Feb. 18, 2010

(65) Prior Publication Data
US 2010/0213573 A1 Aug. 26, 2010

(30) Foreign Application Priority Data

Feb. 20, 2009 (KR) .................. 10-2009-0014423

(51) Int. Cl.
*H01L 29/76* (2006.01)
*H01L 29/00* (2006.01)
(52) U.S. Cl. ........... 257/334; 257/534; 257/E21.18; 257/E21.21; 257/E21.423; 257/E21.66
(58) Field of Classification Search .......... 257/334, 257/E21.66, 534, E21.18, E21.21, E21.423
See application file for complete search history.

(56) References Cited

U.S. PATENT DOCUMENTS

| 6,479,343 B1 | 11/2002 | Hwang et al. | |
|---|---|---|---|
| 6,512,276 B1 | 1/2003 | Tanaka | |
| 6,730,956 B2 | 5/2004 | Bae et al. | |
| 2001/0055851 A1* | 12/2001 | Horii | 438/393 |
| 2006/0226472 A1 | 10/2006 | Baek | |
| 2006/0289932 A1* | 12/2006 | Ahn et al. | 257/334 |

FOREIGN PATENT DOCUMENTS

| JP | 2002-222812 A | 8/2002 |
|---|---|---|
| KR | 10-2002-0036134 A | 5/2002 |
| KR | 10-2006-0108290 A | 10/2006 |

* cited by examiner

*Primary Examiner* — Zandra Smith
*Assistant Examiner* — Tsz Chiu
(74) *Attorney, Agent, or Firm* — Lee & Morse, P.C.

(57) ABSTRACT

A semiconductor device including a plurality of decoupling capacitors formed on a semiconductor substrate, and a plurality of decoupling capacitor contact plugs disposed between the semiconductor substrate and the plurality of decoupling capacitors, the plurality of decoupling capacitor contact plugs being electrically connected to the plurality of decoupling capacitors and including an array of first decoupling capacitor contact plugs and second decoupling capacitor contact plugs.

15 Claims, 4 Drawing Sheets

SEMICONDUCTOR DECOUPLING CAPACITOR DEVICE

BACKGROUND

1. Field

Embodiments relate to a semiconductor device.

2. Description of the Related Art

An integrated circuit device using semiconductor devices may be fabricated by integrating various individual circuit devices, e.g., an electric field effect transistor such as a metal-oxide semiconductor field effect transistor (MOSFET) or a complementary MOSFET, a resistor, a capacitor, etc., into one chip. Generally, such individual devices have been continuously scaled down to provide enhanced performance in relation to operating speed and/or power consumption. For example, in dynamic random access memory (DRAM), demands for improving the operating speed and power consumption have resulted in increased integration of DRAM.

However, if a clock frequency of a semiconductor device is increased for faster operating speed, noise may also increase. In DRAM, when the operating speed is increased, noise—which may momentarily occur between operating voltages, e.g., power voltage Vdd and ground voltage Vss during a reading and/or writing operation—may increase; and thus the operating speed may decrease. Also, a sensing margin of a sense amplification unit within a semiconductor device may be narrowed.

To improve the operating speed and reduce noise, a method of forming a decoupling capacitor which functions as a noise filter has been proposed. In a semiconductor device such as DRAM, the decoupling capacitor may be formed in a peripheral circuit region and may have a structure similar to that of a capacitor formed in a memory cell array region. The decoupling capacitor may have a plurality of bottom electrodes that may be formed in a line on contact plugs having, e.g., line shapes or bar shapes. Two or more decoupling capacitors may share one contact plug so that a large capacitance may be obtained. Dielectric material layers may be formed on each of the bottom electrodes of the decoupling capacitors. Top electrodes may be formed on the dielectric material layers.

The bottom electrodes of the decoupling capacitors may be formed using mold layers formed on the contact plugs. In this case, the bottom electrodes may be formed on inner sidewalls of contact holes, which may be formed in the mold layers, and on portions of the contact plugs exposed in the contact holes.

SUMMARY

Embodiments are directed to a semiconductor device, which substantially overcomes one or more of the drawbacks, limitations and/or disadvantages of the related art.

It is a feature of an embodiment to provide a semiconductor device that prevents or reduces defects in interlayer insulation layers between decoupling capacitor contact plugs despite high integration of the semiconductor device.

At least one of the above and other features and advantages may be realized by providing a semiconductor device including a plurality of decoupling capacitors disposed on a semiconductor substrate, and a plurality of decoupling capacitor contact plugs disposed between the semiconductor substrate and the plurality of decoupling capacitors, the plurality of decoupling capacitor contact plugs being electrically connected to the plurality of decoupling capacitors and including an array of first decoupling capacitor contact plugs and second decoupling capacitor contact plugs, wherein the first decoupling capacitor contact plugs are repeatedly arranged along a first direction at a predetermined distance apart form each other, the second decoupling capacitor contact plugs are spaced at a predetermined distance from the first contact plugs in a second direction, which is different from the first direction, and are repeatedly arranged along the first direction at predetermined distance apart from each other, and the plurality of decoupling capacitor contact plugs are isolated from each other by interlayer insulation layers disposed therebetween, the interlayer insulation layers being in spaces between the decoupling capacitor contact plugs such that the interlayer insulation layers are connected to each other in the second direction, thereby improving mechanical strength thereof.

The first decoupling capacitor contact plugs and the second decoupling capacitor contact plugs may be alternately arranged relative to each other along the second direction.

The spaces between the coupling capacitor contact plugs may include a space between the second decoupling capacitor contact plugs and the space between the second decoupling capacitor contact plugs may be aligned in the second direction with at least one of the plurality of the decoupling capacitors on one of the first decoupling capacitor contact plugs.

Each of the plurality of decoupling capacitor contact plugs may be electrically connected to at least two of the plurality of decoupling capacitors.

The plurality of decoupling capacitors may include cylindrical bottom electrodes.

The semiconductor device may further include a conductive buffer pattern layer between the plurality of decoupling capacitors and the plurality of decoupling capacitor contact plugs.

The interlayer insulation layers may fill the spaces between the decoupling capacitor contact plugs.

At least one of the above and other features and advantages may also be realized by providing a semiconductor device including a semiconductor substrate including a cell array region and a peripheral region adjacent to the cell array region, a plurality of memory cell capacitors electrically connected to a plurality of storage contact plugs disposed in the cell array region of the semiconductor substrate, and a plurality of decoupling capacitors electrically connected to a plurality of decoupling capacitor contact plugs disposed in the peripheral region of the semiconductor substrate, the plurality of decoupling capacitor contact plugs including an array of first decoupling capacitor contact plugs and second decoupling capacitor contact plugs, wherein the first decoupling capacitor contact plugs are repeatedly arranged along a first direction at a predetermined distance apart form each other, the second decoupling capacitor contact plugs are spaced at a predetermined distance from the first decoupling capacitor contact plugs in a second direction, which is different from the first direction, and are repeatedly arranged along the first direction at a predetermined distance apart from each other, and the plurality of decoupling capacitor contact plugs are isolated from each other by interlayer insulation layers disposed therebetween, the interlayer insulation layers being in spaces between the decoupling capacitor contact plugs such that the interlayer insulation layers are connected to each other in the second direction, thereby improving mechanical strength thereof.

The first decoupling capacitor contact plugs and the second decoupling capacitor contact plugs may be alternately arranged relative to each other along the second direction.

The spaces between the coupling capacitor contact plugs may include a space between the second decoupling capacitor contact plugs and the space between the second decoupling capacitor contact plugs may be aligned in the second direction with at least one of the plurality of the decoupling capacitors on one of the first decoupling capacitor contact plugs.

Each of the plurality of decoupling capacitor contact plugs may be electrically connected to at least two of the plurality of decoupling capacitors.

The plurality of decoupling capacitors may include cylindrical bottom electrodes.

The interlayer insulation layers may fill the spaces between the decoupling capacitor contact plugs.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
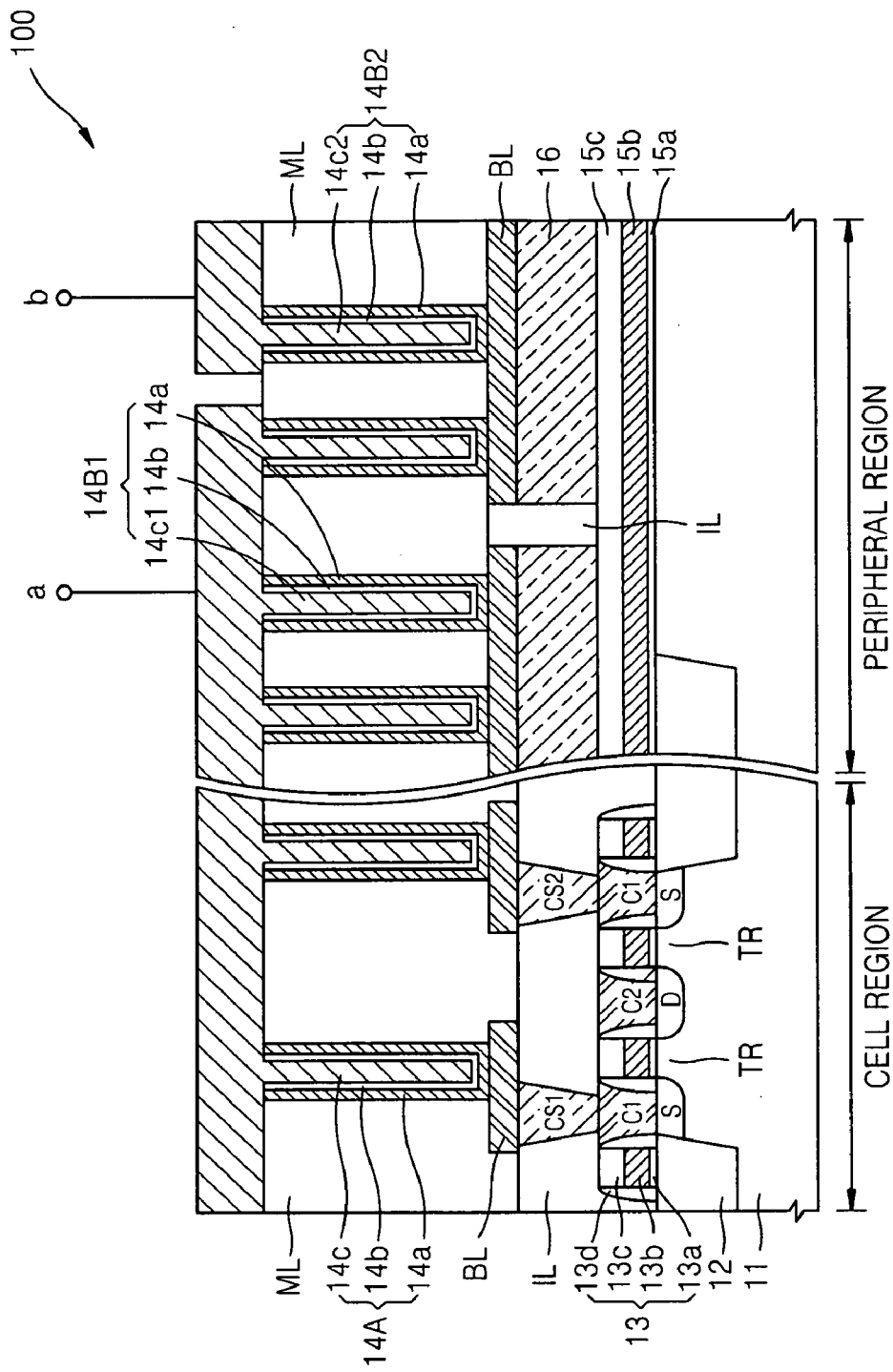
FIG. 1 illustrates a cross-sectional view of a semiconductor device including a plurality of decoupling capacitors according to an embodiment.

Korean Patent Application No. 10-2009-0014423, filed on Feb. 20, 2009, in the Korean Intellectual Property Office, and entitled: "Semiconductor Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "directly on" another element, there are no intervening elements present. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiment.

In the drawings, for example, illustrated shapes may be deformed according to fabrication technology and/or tolerances. Therefore, the embodiments are not limited to certain shapes illustrated in the present specification, and may include modifications of shapes caused in fabrication processes.

As mentioned herein, the semiconductor device may be a device including contact plugs and decoupling capacitors electrically connected to the contact plugs. The semiconductor device of an embodiment may include Very-Large-Scale-Integrations circuit, e.g., a micro processor, and/or a semiconductor memory device, e.g., DRAM or SDRAM.

FIG. 1 illustrates a cross-sectional view of a semiconductor device 100 including a plurality of decoupling capacitors 14B1 and 14B2 according to an embodiment. Referring to FIG. 1, a semiconductor substrate 11 may include a cell array region and a peripheral region adjacent to the cell array region. A suitable lower structure, e.g., a field-effect transistor TR as a switching device and/or buried landing pads including storage landing pads C1 and bit line landing pads C2 connected to source/drain regions S and D of the field-effect transistor TR, may be disposed in the cell array region.

For example, to form the lower structure, a device isolating layer 12, e.g., a shallow trench isolation (STI) layer, may be formed in the semiconductor substrate 11 to define an active region. Then, e.g., an oxide layer, a gate conductive layer, and an insulation layer may be sequentially deposited onto the semiconductor substrate 11 and patterned, thereby forming a gate stack including, e.g., a gate insulation layer 13a, a gate electrode 13b, and a capping layer 13c. The gate insulation layer 13a may include, e.g., a thermal oxide layer. The gate electrode 13b may include, e.g., a conductive poly-silicon layer, a tungsten silicide layer, or a stacked structure thereof. The capping layer 13c may include, e.g., a silicon nitride layer.

Then, by performing ion implantation using the gate stack as an ion implanting mask, the source region S and the drain region D may be formed in the active region of the semiconductor substrate 11. Next, a gate spacer 13d may be formed on sidewalls of the gate stack so that word lines 13 may be completed. Then, an interlayer insulation layer IL may be formed on the lower structure. Storage contact plugs CS1 and CS2 may be formed in the interlayer insulation layer IL. The storage contact plugs CS1 and CS2 may be connected to the storage landing pads C1.

Memory cell capacitors 14A, which may be electrically connected to the source region S of the field-effect transistor TR via the storage landing pads C1, may be formed on the storage contact plugs CS1 and CS2. The drain region D of the field-effect transistor TR may be connected to a bit line (not shown) via the bit line landing pad C2. In this case, the semiconductor device 100 may have a capacitor over bit line (COB) structure in which a cell capacitor is formed over the bit line. The buried landing pads C1 and C2 may be omitted when the storage contact plugs CS1 and CS2 and/or the bit line are directly connected to the source/drain regions S and D of the field-effect transistor TR, respectively. Alternatively, other vias may be formed for electrical connections between the cell capacitor and the field-effect transistors TR and between the bit line and the field-effect transistors TR.

In an embodiment, a conductive buffer pattern layer BL may be formed on the storage contact plugs CS1 and CS2 and/or on decoupling capacitor contact plugs 16. The conductive buffer pattern layer BL may reduce or prevent a defective contact due to misalignment during a photolithography operation. Such a defective contact may occur between a storage contact plug CS1 or CS2 and the cell capacitor 14A and/or between the decoupling capacitor contact plugs 16 and decoupling capacitors 14B1 and 14B2.

Forming the lower structure and the storage contact plugs CS1 and CS2 described above may simultaneously manufacture the following structures in the peripheral region. As shown in FIG. 1, material layers 15a, 15b, and 15c, which may constitute a gate stack in the cell region, may be sequentially stacked in the peripheral region of the semiconductor substrate 11. The decoupling capacitor contact plugs 16 may be simultaneously formed on a capping layer 15c when the storage contact plugs CS1 and CS2 are formed in the cell region. The decoupling capacitor contact plugs 16 may be isolated from each other by interlayer insulation layers IL disposed therebetween. The interlayer insulation layers IL maybe in and pass through, i.e., fill, spaces between decoupling capacitor contact plugs 16 and may be connected to each other, thereby supporting themselves. Such features of the interlayer insulation layers IL are more clearly illustrated in FIG. 2 and described below.

Then, the plurality of memory cell capacitors 14A and the plurality of decoupling capacitors 14B1 and 14B2 may be respectively formed on the storage contact plugs CS1 and CS2 and the decoupling capacitor contact plugs 16. The capacitors 14A, 14B1, and 14B2 may be simultaneously formed. The memory cell capacitors 14A and the decoupling capacitors 14B1 and 14B2 may each have bottom electrodes 14a having a cylindrical shape. The cylindrical shape may enlarge a surface area of bottom electrodes.

The cylindrical bottom electrode 14a may be formed by using a mold layer ML having the same height as the cylindrical bottom electrode 14a. However, other suitable methods may be used. For example, for increasing the surface area of the bottom electrode 14a, the bottom electrode 14a may include, e.g., hemisphere-shaped grains (HSG), quantum dots, or micro-crystals, and thus the surface of the bottom electrode 14a may have an unsmooth surface morphology. The cell capacitors 14A and the decoupling capacitors 14B1 and 14B2 may be completed by forming top electrodes 14c, 14c1, or 14c2 on a dielectric material layer 14b after a storage node separating operation is completed.

Figure 2:
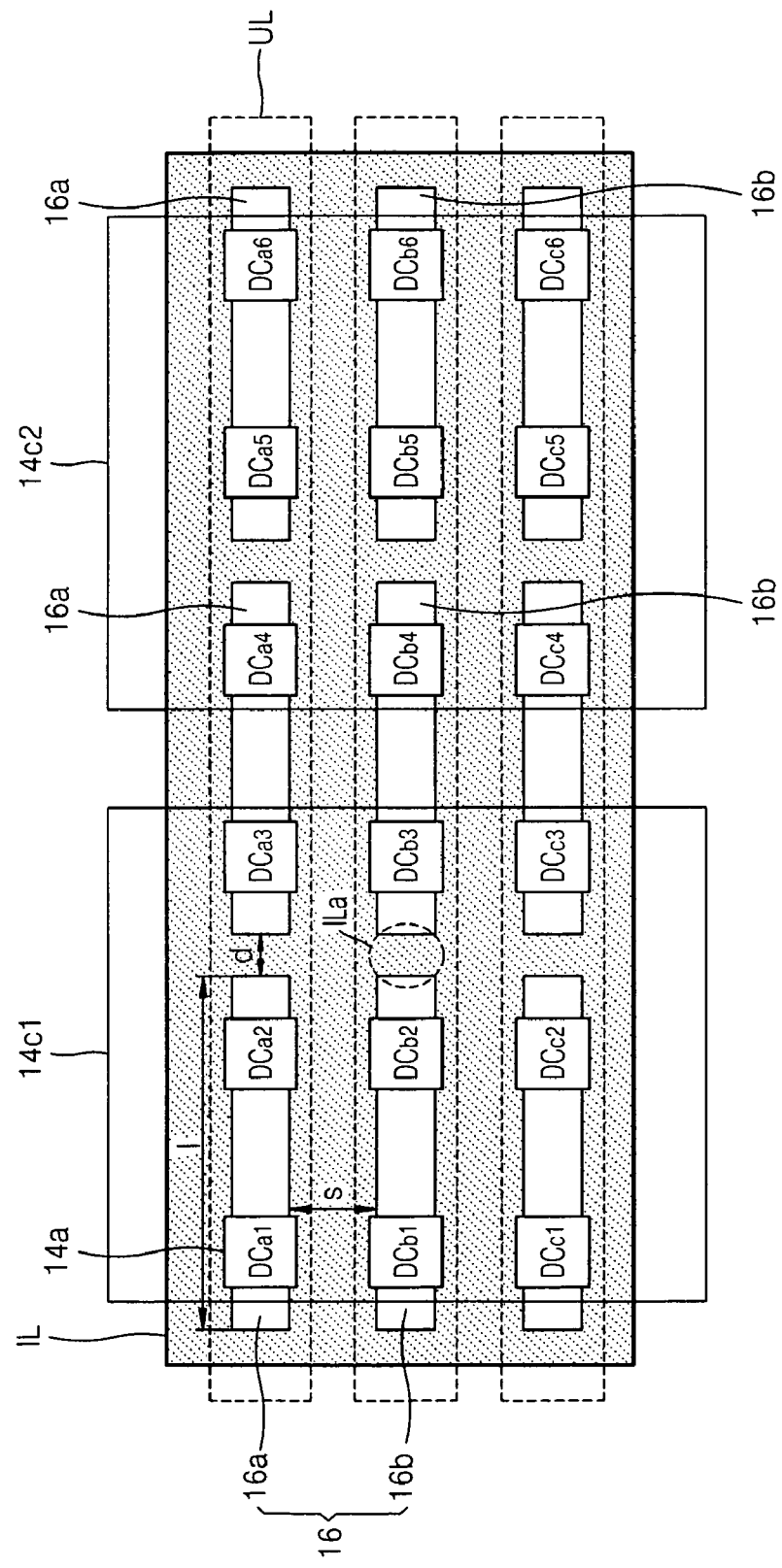
FIG. 2 illustrates a plan view of decoupling capacitor contact plugs and bottom electrodes and top electrodes of a decoupling capacitor according to an embodiment.
Figure 3:
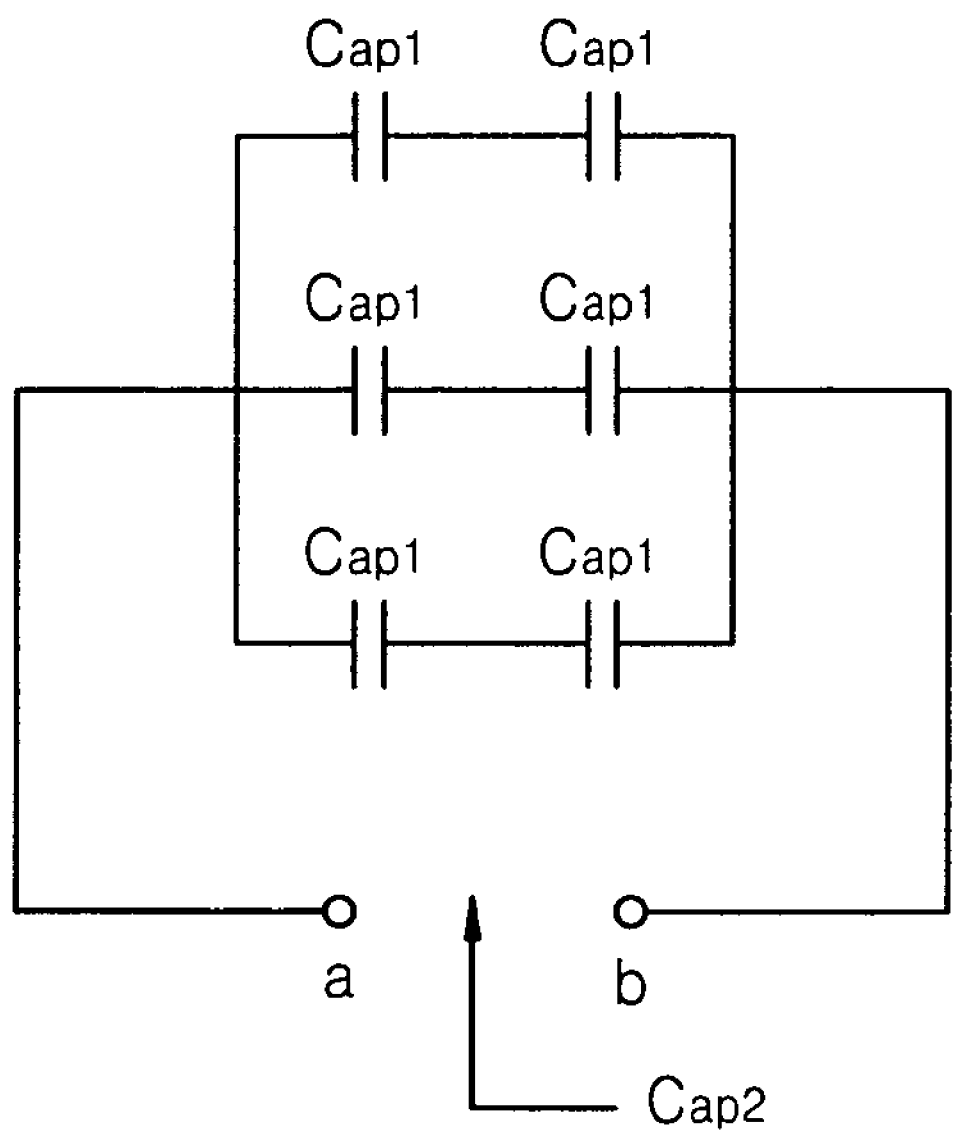
FIG. 3 illustrates an equivalent circuit diagram of the decoupling capacitors illustrated in FIG. 2.

FIG. 2 illustrates a plan view showing the decoupling capacitor contact plugs 16, the bottom electrode 14a, and the top electrodes 14c1 and 14c2 of the decoupling capacitor DC according to an embodiment. FIG. 3 illustrates an equivalent circuit diagram of the decoupling capacitors shown in FIG. 2. For convenience of explanation, a dielectric material layer (14b of FIG. 1) of the decoupling capacitor is omitted in FIG. 2; and FIG. 1 may be referred to for understanding elements not shown in FIG. 2.

Referring to FIG. 2, each of the plurality of decoupling capacitor contact plugs 16 may be isolated from each other by the interlayer insulation layers IL disposed therebetween. The interlayer insulation layer IL may include, e.g., a material having etching selectivity with respect to the mold layer ML such that the interlayer insulation layer IL may not be damaged during subsequent patterning of the mold layer ML. For example, if the mold layer ML includes a silicon nitride layer, the interlayer insulation layer IL may include a silicon oxide layer, and vice versa.

The plurality of decoupling capacitor contact plugs 16 may include first decoupling capacitor contact plugs 16a, which may be repeatedly arranged along a first direction at a distance d apart from each other. In addition, the plurality of decoupling capacitor contact plugs 16 may include second decoupling capacitor contact plugs 16b. The second decoupling capacitor contact plugs 16b may be spaced at a distance s from first decoupling capacitor contact plugs 16a in a second direction. The second direction may be different from the first direction. The second direction may be perpendicular to the first direction. The second decoupling capacitor contact plugs 16b may also be repeatedly arranged along the first direction at a distance d apart from each other. In an implementation, the decoupling capacitor contact plugs 16 may each have a length l in the first direction. In some embodiments, as illustrated in FIG. 2, the first decoupling capacitor contact plugs 16a and second decoupling capacitor contact plugs 16 may be aligned with each other in both the first and second directions. The number of repeatedly arranged first decoupling capacitor contact plugs 16a and second decoupling capacitor contact plugs 16b may be determined according to design conditions.

To form the decoupling capacitor contact plugs 16, an insulation layer may be formed on the semiconductor substrate 11 in which the lower structure has been previously formed. Then, the interlayer insulation layer IL may be completed by forming openings for accommodating the decoupling capacitor contact plugs 16 in the insulation layer by, e.g., dry or wet etching, the insulation layer. Then, a conductive layer may be formed on the interlayer insulation layer IL to fill the openings. Portions of the conductive layer may then be removed by performing, e.g., etch-back or chemical-mechanical polishing (CMP), until a top surface of the interlayer insulation layer IL is exposed. Thus, the decoupling capacitor contact plugs 16 isolated in the openings may be formed.

However, the above description of forming the decoupling capacitor contact plugs 16 is merely exemplary, and the embodiments are not limited thereto. For example, the plurality of decoupling capacitor contact plugs 16 may be formed in advance by forming a conductive layer on the semiconductor substrate 11 in which the lower structure is formed and then patterning the conductive layer. Next, the interlayer insulation layers IL may be formed between the decoupling capacitor contact plugs 16 by forming an insulation layer filling spaces between the plurality of decoupling capacitor contact plugs 16 and performing, e.g., etch-back or CMP, to remove remnant insulation layer.

As illustrated in the FIG. 2, the interlayer insulation layer IL may extend along the first direction between the decoupling capacitor contact plugs 16. The interlayer insulation layer IL may also extend in the second direction between the decoupling capacitor contact plugs 16, which may be separated from each other in the first direction. The interlayer insulating layer may thereby be in, and in particular may fill a space between the decoupling capacitor contact plugs 16. Thus, the interlayer insulation layer IL may have a dense, mesh-like structure.

The interlayer insulation layers IL in the peripheral region according to an embodiment may be mechanically more stable than a typical bar-type structure in which different portions of interlayer insulation layers are not connected to each other in the second direction. Thus, possible defects during patterning a mold layer, e.g., collapse or lift of a pattern of the interlayer insulation layer IL, may be advantageously reduced or prevented.

Next, referring to FIG. 2, the decoupling capacitor contact plugs 16 may be electrically connected to each other via a bottom interconnection pattern layer UL extending in the first direction below the decoupling capacitor contact plugs 16. The bottom interconnection pattern layer UL may be provided by patterning the conductive layer 15b deposited onto the peripheral region when the gate electrode 13b is formed in the cell region. Alternatively, the bottom interconnection pattern layer UL may be provided by using a conductive layer deposited when the storage landing pad C1 and the bit line landing pad C2, which are illustrated in FIG. 1, are formed.

As illustrated in FIG. 2, the bottom interconnection pattern layer UL may be connected to all of the decoupling capacitor contact plugs 16 that are arranged in the first direction. However, such a configuration of the bottom interconnection pattern layer UL and the decoupling capacitor contact plugs 16 may vary according to design demands.

Decoupling capacitors $DC_{a1}$ through $DC_{c6}$ that may be formed on the decoupling capacitor contact plugs 16 may include the bottom electrode 14a and the top electrodes 14c1 or 14c2. In each group of the decoupling capacitors ($DC_{a1}$, $DC_{a2}$, $DC_{a3}$), ($DC_{b1}$, $DC_{b2}$, $DC_{b3}$), and ($DC_{c1}$, $DC_{c2}$, $DC_{c3}$), the decoupling capacitors $DC_{a1}$, $DC_{a2}$, ..., $DC_{c3}$ may share one top electrode 14c1 so that the decoupling capacitors $DC_{a1}$, $DC_{a2}$, ..., $DC_{c3}$ may be connected to each other in parallel. Likewise, in other groups of the decoupling capacitors ($DC_{a4}$, $DC_{a5}$, $DC_{a6}$), ($DC_{b4}$, $DC_{b5}$, $DC_{b6}$), and ($DC_{c4}$, $DC_{c5}$, $DC_{c6}$), the decoupling capacitors $DC_{a4}$, $DC_{a5}$, ..., $DC_{c6}$ may share the other top electrode 14c2 so that the decoupling capacitors $DC_{a4}$, $DC_{a5}$, ..., $DC_{c6}$ may also be connected to each other in parallel.

Each of the groups of the decoupling capacitors connected to each other in parallel may be indicated as one equivalent capacitor Cap1, as illustrated in FIG. 3. The equivalent capacitors Cap1 may be connected to each other in series via the bottom interconnection pattern layer UL to implement a two stage cell type decoupling capacitor.

When the decoupling capacitors 14B1 and 14B2 in the peripheral region illustrated in FIG. 1 have the configuration illustrated in FIG. 2, an equivalent capacitor Cap2 viewed from terminals a and b may be 3/2×Cap1. However, the embodiments are not limited to a two stage cell type decoupling capacitor. For example, the decoupling capacitors DC illustrated in FIG. 2 may also share one identical top electrode to implement a single stage cell type decoupling capacitor, which may be indicated as one equivalent capacitor.

Figure 4:
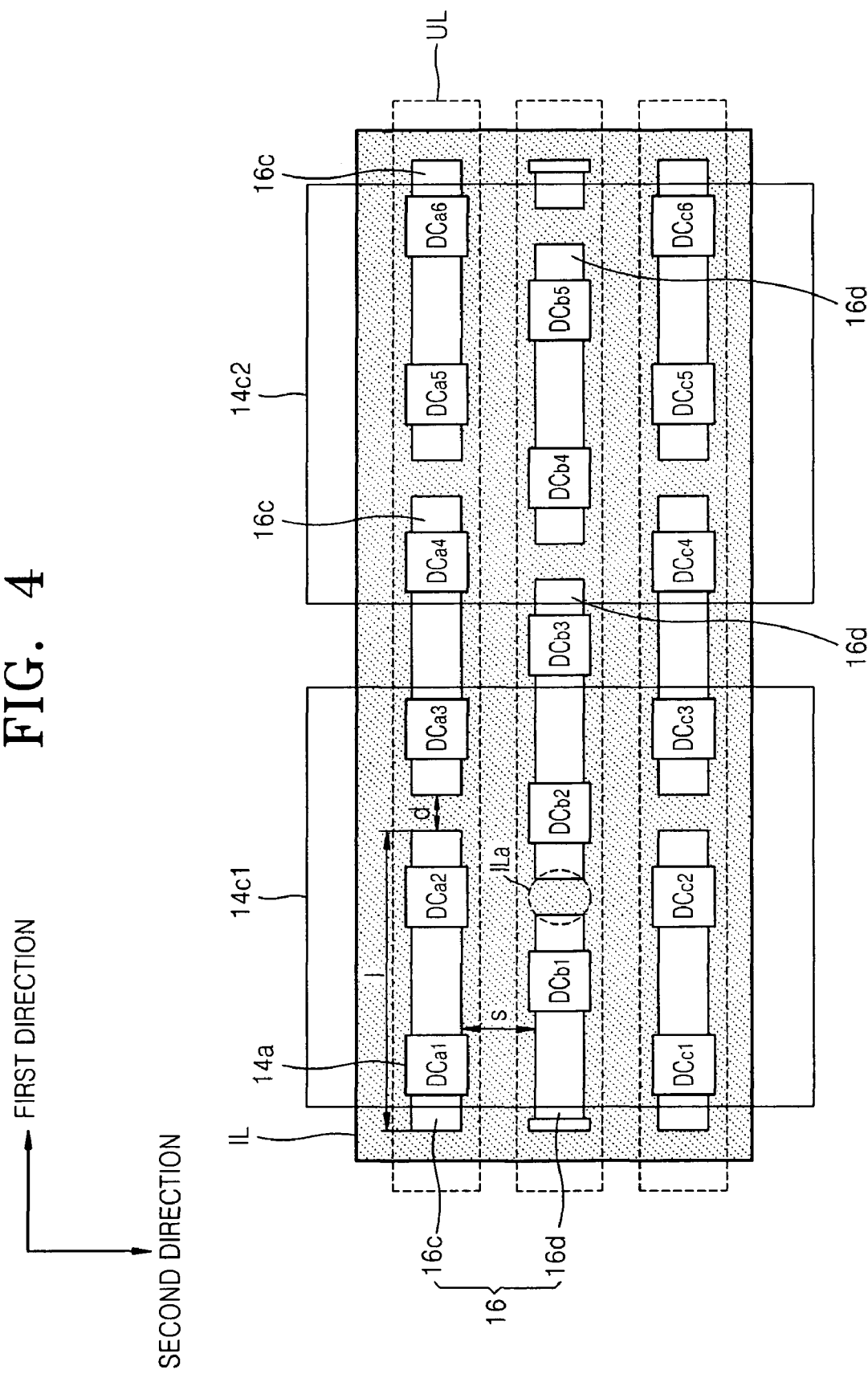
FIG. 4 illustrates a plan view of decoupling capacitor contact plugs and bottom electrodes and top electrodes of a decoupling capacitor according to another embodiment.

FIG. 4 illustrates a plan view showing the decoupling capacitor contact plugs 16 and the bottom electrode 14a and the top electrodes 14c1 and 14c2 of a semiconductor device according to another embodiment. Unless otherwise described below, the above description of the elements shown in FIG. 2 may be referred to for the elements disclosed in FIG. 4.

Referring to FIG. 4, the present embodiment may be similar to the embodiment illustrated in FIG. 2 in that the plurality of decoupling capacitor contact plugs 16 may include first decoupling capacitor contact plugs 16c and second decoupling capacitor contact plugs 16d. The first decoupling capacitor contact plugs 16c may be repeatedly arranged along a first direction at a distance d apart from each other. The second decoupling capacitor contact plugs 16d may be arranged at a distance s apart from the first decoupling capacitor contact plugs 16c in the second direction. However, unlike the embodiment illustrated in FIG. 2, the first decoupling capacitor contact plugs 16c and the second decoupling capacitor contact plugs 16d may be alternately arranged relative to each other in the second direction.

In an implementation, at least one of the plurality of the decoupling capacitors formed on the first decoupling capacitor contact plugs 16c, e.g. the decoupling capacitor $DC_{a2}$ of the decoupling capacitor $DC_{a1}$ and $DC_{a2}$, may be aligned with a space between the second decoupling capacitor contact plugs 16d in the second direction. Thus, the interlayer insulation layers IL may be connected to each other in the second direction and adjacent to the top surfaces of decoupling capacitor contact plugs 16 contacting the decoupling capacitor $DC_{a2}$. A region ILa indicated by a broken circular line refers to portions of the interlayer insulation layers IL connected to each other in the second direction.

Therefore, according to the present embodiment, even if a portion of the interlayer insulation layer IL is partially exposed through contact holes disposed in the mold layer ML during patterning of the mold layer ML and forming the decoupling capacitors DC, the exposed portions of the interlayer insulation layers IL may be connected to each other in the second direction, thereby obtaining a strong mechanical support so as to reduce or prevent defects, e.g., collapse or lift of a pattern of the interlayer insulation layer IL.

Next, referring to FIG. 4, the decoupling capacitor contact plugs 16 may be electrically connected to each other via the bottom interconnection pattern layer UL extending in the first direction. In each group of the decoupling capacitors ($DC_{a1}$, $DC_{a2}$, $DC_{a3}$), ($DC_{b1}$, $DC_{b2}$), and ($DC_{c1}$, $DC_{c2}$, $DC_{c3}$), the decoupling capacitors $DC_{a1}$, $DC_{a2}$, ..., $DC_{c3}$ may share one top electrode 14c1, so that the decoupling capacitors $DC_{a1}$, $DC_{a2}$, ..., $DC_{c3}$ may be connected each other in parallel. Likewise, in the other group of the decoupling capacitors ($DC_{a4}$, $DC_{a5}$, $DC_{a6}$), ($DC_{b4}$, $DC_{b5}$), and ($DC_{c4}$, $DC_{c5}$, $DC_{c6}$), the decoupling capacitors $DC_{a4}$, $DC_{a5}$, ..., $DC_{c6}$ may share the other top electrode 14c2 so that the decoupling capacitors $DC_{a4}$, $DC_{a5}$, ..., $DC_{c6}$ may also be connected to each other in parallel.

Each of the groups of the decoupling capacitors connected to each other in parallel may implement one equivalent capacitor Cap1 as shown in FIG. 3. It will be noted that a pair of the decoupling capacitors $DC_{b1}$ and $DC_{b2}$ and another pair of the decoupling capacitor $DC_{b4}$ and $DC_{b5}$, which may be formed on the second decoupling capacitor contact plugs 16d disposed in the middle row, may form one equivalent capacitor respectively by two own decoupling capacitors. It will be well understood that the same capacitance as the equivalent circuit shown in FIG. 3 may be obtained by suitably adjusting the length l and the distance d of the decoupling capacitor contact plugs 16 and the size and the shape of the top electrodes 14c1 and 14c2.

The groups of the decoupling capacitors connected to each other in parallel may be indicated as one equivalent capacitor Cap1, as shown in FIG. 3. The equivalent capacitors Cap1 may be connected to each other in series via the bottom interconnection pattern layer UL to implement a two stage cell type decoupling capacitor.

As described above with respect to FIG. 2, the decoupling capacitors DC that are serially connected to each other via the bottom interconnection pattern layer UL may embody a two stage cell type decoupling capacitor. However, this is merely exemplary, and the decoupling capacitors DC may embody a single stage cell type decoupling capacitor by sharing one identical top electrode.

Furthermore, even though the bottom electrode 14a illustrated in FIG. 2 has a rectangular shape in a plan view, the embodiments are not limited thereto. For example, the bottom electrode 14a of the decoupling capacitors DC may have a circular shape. Furthermore, the bottom electrode 14a of the decoupling capacitor DC may have, e.g., a rhombic shape or an elliptical shape with a major axis extending in the first direction or the second direction. Also, decoupling capacitors DC may be arranged in two or more rows on one decoupling capacitor contact plug 16.

The shape of the decoupling capacitor contact plugs 16 is not limited to a rectangular shape. The decoupling capacitor contact plugs 16 may have side walls that protrude and have, e.g., a triangular shape, rectangular shape, and hemispheric shape, in a plan view. These shapes may increase contact area between the decoupling capacitor contact plugs 16 and the interlayer insulation layers IL. Thus, mechanical strength of the interlayer insulation layers IL may be enhanced.

The embodiments may include the above mentioned embodiments and other various embodiments including a method of fabricating a semiconductor device. The method may include forming a plurality of decoupling capacitor contact plugs on a semiconductor substrate, and forming a plurality of decoupling capacitors on and electrically connected to the plurality of decoupling capacitor contact plugs. The forming of the plurality of decoupling capacitor contact plugs may include forming an insulation layer on the semiconductor substrate, forming openings in the insulation layer for accommodating decoupling capacitor contact plugs, forming a conductive layer on the interlayer insulation layer to fill the openings, and removing a portion of the conductive layer until a top surface of the interlayer insulation layer is exposed to form decoupling capacitor contact plugs in the openings and isolated from each other. The plurality of decoupling capacitor contact plugs may be patterned to include first decoupling capacitor contact plugs, which may be repeatedly arranged along a first direction at a predetermined distance apart form each other. In addition, the plurality of decoupling capacitor contact plugs may include second decoupling capacitor contact plugs, which may be spaced at a predetermined distance from the first contact plugs in a second direction. The second direction may be different from the first direction. The second decoupling capacitor contact plugs may be repeatedly arranged along the first direction at a predetermined distance apart from each other. The plurality of decoupling capacitor contact plugs may be isolated from each other by interlayer insulation layers disposed therebetween. The interlayer insulation layers may be in, and more specifically may pass through, i.e., fill, spaces between the decoupling capacitor contact plugs so that portions of the interlayer insulation layers may connect to each other in the second direction. Thus, mechanical strength of the interlayer insulation layer may be improved.

Another embodiment may include method of fabricating a semiconductor device. The method may include forming a plurality of decoupling capacitor contact plugs on a semiconductor substrate and forming a plurality of decoupling capacitors on and electrically connected to the plurality of decoupling capacitor contact plugs. The forming of the plurality of decoupling capacitor contact plugs may include forming a plurality of decoupling capacitor contact plugs by forming and patterning a conductive layer on a semiconductor substrate, forming an insulation layer that fills spaces between the plurality of decoupling capacitor contact plugs, and removing portions of the insulation layer until top surfaces of the plurality of decoupling capacitor contact plugs are exposed to thereby insulate the decoupling capacitor contact plugs. The plurality of decoupling capacitor contact plugs may be patterned to include first decoupling capacitor contact plugs, which may be repeatedly arranged along a first direction at a predetermined distance apart form each other. In addition, the plurality of decoupling capacitor contact plugs may include second decoupling capacitor contact plugs, which may be spaced at a predetermined distance from the first decoupling capacitor contact plugs in the second direction. The second direction may be different from the first direction. The second decoupling capacitor contact plugs may be repeatedly arranged along the first direction at a predetermined distance apart from each other. The plurality of decoupling capacitor contact plugs may be isolated from each other by interlayer insulation layers disposed therebetween. The interlayer insulation layers may be in, and more specifically may pass through, i.e., fill, spaces between the decoupling capacitor contact plugs so that portions of the interlayer insulation layers may be connected to each other in the second direction, thereby improving mechanical strength of the interlaying insulation layers.

Embodiments may also include another method of fabricating a semiconductor device. The method may include providing a semiconductor substrate having a cell array region and a peripheral region adjacent to the cell array region, forming a plurality of storage contact plugs in the cell array region, forming a plurality of decoupling capacitor contact plugs in the peripheral region, forming a plurality of memory cell capacitors electrically connected to the plurality of storage contact plugs, and forming a plurality of decoupling capacitors electrically connected to the plurality of decoupling capacitor contact plugs. The plurality of decoupling capacitor contact plugs may be patterned to include first decoupling capacitor contact plugs, which may be repeatedly arranged along a first direction at a predetermined distance apart form each other. In addition, the plurality of decoupling capacitor contact plugs may include second decoupling capacitor contact plugs, which may be spaced at a predetermined distance from the first decoupling capacitor contact plugs in a second direction. The second direction may be different from the first direction. The second decoupling capacitor contact plugs may be repeatedly arranged along the first direction at a predetermined distance apart from each other. The plurality of decoupling capacitor contact plugs may be isolated from each other by interlayer insulation layers disposed therebetween. The interlayer insulation layers may be in, and more specifically may pass through, i.e., fill, spaces between the decoupling capacitor contact plugs so that portions of the interlayer insulation layers may be connected to each other in the second direction, thereby improving mechanical strength of the interlayer insulation layers.

In an implementation, the forming of the plurality of storage contact plugs and the forming of the plurality of decoupling capacitor contact plugs for decoupling capacitor may be performed simultaneously.

In another implementation, the forming of the plurality of memory cell capacitors and the forming of the plurality of decoupling capacitors may be performed simultaneously.

As for drawbacks of other semiconductor devices and their fabrication processes, for forming the contact holes in the mold layers, a series of patterning processes, e.g., forming a suitable mask layer for defining regions for forming contact holes therein on the top surface of the mold layer, etching the mold layer by using the mask layer as an etching mask, rinsing operation, etc., may be performed. When the mold layer is etched, defects, e.g., collapses or lifts of interlayer insulation layers under the mold layers, may frequently appear. As integration of semiconductor memory devices becomes more dense, such defects of the interlayer insulation layers may occur more often.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a plurality of decoupling capacitors disposed on a semiconductor substrate; and
a plurality of decoupling capacitor contact plugs disposed between the semiconductor substrate and the plurality of decoupling capacitors, the plurality of decoupling capacitor contact plugs being electrically connected to the plurality of decoupling capacitors and including an array of first decoupling capacitor contact plugs and second decoupling capacitor contact plugs,
wherein:
the first decoupling capacitor contact plugs are repeatedly arranged along a first direction at a predetermined distance apart from each other,
the second decoupling capacitor contact plugs are spaced at a predetermined distance from the first decoupling capacitor contact plugs in a second direction, which is different from the first direction, and are repeatedly arranged along the first direction at predetermined distance apart from each other, and
the plurality of decoupling capacitor contact plugs are isolated from each other by interlayer insulation layers disposed therebetween, the interlayer insulation layers being in spaces between the decoupling capacitor contact plugs such that the interlayer insulation layers are connected to each other in the second direction, thereby improving mechanical strength thereof.

2. The semiconductor device as claimed in claim 1, wherein the first decoupling capacitor contact plugs and the second decoupling capacitor contact plugs are alternately arranged relative to each other along the second direction.

3. The semiconductor device as claimed in claim 2, wherein the spaces between the coupling capacitor contact plugs include a space between the second decoupling capacitor contact plugs and wherein the space between the second decoupling capacitor contact plugs is aligned in the second direction with at least one of the plurality of the decoupling capacitors on one of the first decoupling capacitor contact plugs.

4. The semiconductor device as claimed in claim 1, wherein each of the plurality of decoupling capacitor contact plugs is electrically connected to at least two of the plurality of decoupling capacitors.

5. The semiconductor device as claimed in claim 1, wherein the plurality of decoupling capacitors includes cylindrical bottom electrodes.

6. The semiconductor device as claimed in claim 1, further comprising a conductive buffer pattern layer between the plurality of decoupling capacitors and the plurality of decoupling capacitor contact plugs.

7. The semiconductor device as claimed in claim 1, wherein the interlayer insulation layers fill the spaces between the decoupling capacitor contact plugs.

8. The semiconductor device as claimed in claim 1, wherein the second decoupling capacitor contact plugs are offset from the first decoupling capacitor contact plugs relative to the second direction such that a space between the second decoupling capacitor contact plugs is aligned with at least one of the plurality of the decoupling capacitors on one of the first decoupling capacitor contact plugs in the second direction.

9. A semiconductor device, comprising:
a semiconductor substrate including a cell array region and a peripheral region adjacent to the cell array region;
a plurality of memory cell capacitors electrically connected to a plurality of storage contact plugs disposed in the cell array region of the semiconductor substrate; and
a plurality of decoupling capacitors electrically connected to a plurality of decoupling capacitor contact plugs disposed in the peripheral region of the semiconductor substrate, the plurality of decoupling capacitor contact plugs including an array of first decoupling capacitor contact plugs and second decoupling capacitor contact plugs,
wherein:
the first decoupling capacitor contact plugs are repeatedly arranged along a first direction at a predetermined distance apart from each other,
the second decoupling capacitor contact plugs are spaced at a predetermined distance from the first decoupling capacitor contact plugs in a second direction, which is different from the first direction, and are repeatedly arranged along the first direction at a predetermined distance apart from each other, and
the plurality of decoupling capacitor contact plugs are isolated from each other by interlayer insulation layers disposed therebetween, the interlayer insulation layers being in spaces between the decoupling capacitor contact plugs such that the interlayer insulation layers are connected to each other in the second direction, thereby improving mechanical strength thereof.

10. The semiconductor device as claimed in claim 9, wherein the first decoupling capacitor contact plugs and the second decoupling capacitor contact plugs are alternately arranged relative to each other along the second direction.

11. The semiconductor device as claimed in claim 10, wherein the spaces between the coupling capacitor contact plugs include a space between the second decoupling capacitor contact plugs and wherein the space between the second decoupling capacitor contact plugs is aligned in the second direction with at least one of the plurality of the decoupling capacitors on one of the first decoupling capacitor contact plugs.

12. The semiconductor device as claimed in claim 9, wherein each of the plurality of decoupling capacitor contact plugs is electrically connected to at least two of the plurality of decoupling capacitors.

13. The semiconductor device as claimed in claim 9, wherein the plurality of decoupling capacitors includes cylindrical bottom electrodes.

14. The semiconductor device as claimed in claim 9, wherein the interlayer insulation layers fill the spaces between the decoupling capacitor contact plugs.

15. The semiconductor device as claimed in claim 9, wherein the second decoupling capacitor contact plugs are offset from the first decoupling capacitor contact plugs relative to the second direction such that a space between the second decoupling capacitor contact plugs is aligned with at least one of the plurality of the decoupling capacitors on one of the first decoupling capacitor contact plugs in the second direction.

* * * * *